(12) United States Patent
Jones et al.

(10) Patent No.: US 6,284,389 B1
(45) Date of Patent: Sep. 4, 2001

(54) COMPOSITE MATERIALS AND METHODS FOR MANUFACTURING COMPOSITE MATERIALS

(75) Inventors: Herman L. Jones, Wenatchee; Edward A. Taylor, East Wenatchee, both of WA (US)

(73) Assignee: Pacific Aerospace & Electronics, Inc., Wenatchee, WA (US)

( * ) Notice: Subject to any disclaimer, the term of this patent is extended or adjusted under 35 U.S.C. 154(b) by 0 days.

(21) Appl. No.: 09/303,196

(22) Filed: Apr. 30, 1999

(51) Int. Cl.[7] .............................. B32B 15/00; B32B 15/20
(52) U.S. Cl. ........................ 428/614; 428/621; 428/632; 428/651; 428/654; 361/704; 361/708; 148/516; 148/527; 148/530; 148/532; 148/535
(58) Field of Search .................................. 428/614, 621, 428/632, 633, 650, 652, 651, 653, 654, 469, 472.2; 148/516, 527, 529, 530, 532, 531, 535; 361/704, 708

(56) References Cited

U.S. PATENT DOCUMENTS

| | | | |
|---|---|---|---|
| 4,680,618 | 7/1987 | Kuroda et al. ........................ 357/74 |
| 5,002,115 | 3/1991 | Noordegraaf et al. ................. 164/97 |
| 5,025,849 | 6/1991 | Karmarker et al. .................... 164/97 |
| 5,039,577 | * 8/1991 | Knoell et al. ......................... 428/650 |
| 5,040,588 | 8/1991 | Newkirk et al. ....................... 164/97 |
| 5,163,499 | 11/1992 | Newkirk et al. ....................... 164/98 |
| 5,223,278 | 6/1993 | Nicetto ................................ 425/150 |
| 5,298,683 | 3/1994 | Taylor ........................... 174/152 GM |
| 5,413,751 | 5/1995 | Polese et al. ........................... 419/23 |
| 5,433,260 | 7/1995 | Taylor ................................... 164/97 |
| 5,526,867 | 6/1996 | Keck et al. ............................ 164/97 |
| 5,616,421 | * 4/1997 | Sawtell et al. ........................ 428/614 |
| 5,675,122 | * 10/1997 | Taylor ............................... 174/50.58 |
| 5,704,212 | 1/1998 | Erler et al. ............................... 62/3.2 |
| 5,746,267 | * 5/1998 | Yun et al. .............................. 164/65 |
| 5,775,403 | * 7/1998 | Premkumar et al. .................. 164/98 |
| 5,865,912 | 2/1999 | Morimoto et al. .................... 148/440 |
| 5,878,322 | 3/1999 | Polese .................................... 419/38 |
| 5,886,407 | * 3/1999 | Polese et al. ......................... 257/706 |
| 5,972,737 | 10/1999 | Polese et al. ......................... 438/122 |

FOREIGN PATENT DOCUMENTS 9427765    12/1994  (WO) ............................... B22F/3/00

OTHER PUBLICATIONS

"AlSiC Performance Package," PCC–Advanced Forming Technology. pp. 1–9 (1997).*

Ahmed A. Abdel–Hamid, "Hot Dip Aluminide Coating of Ti and the Effect of Impurities and Alloyin gAdditions in the Molten Al Bath", *Bd.*, vol. 82, H. 12, pp. 921–927 (1991) (no month).

* cited by examiner

Primary Examiner—Deborah Jones
Assistant Examiner—Bryant Young
(74) Attorney, Agent, or Firm—Ann W. Speckman; James E. Klaniecki

(57) ABSTRACT

Composite materials are composed of a primary metallic base material, such as a titanium metallic material, metallurgically bonded to one or more secondary materials having desirable thermal conductivity properties and having a coefficient of thermal expansion ("CTE") that generally matches the CTE of the primary metallic material. An exemplary composite material is composed of a titanium primary material metallurgically bonded to a secondary metal matrix composite material having a high thermal conductivity, such as aluminum silicon carbide. Methods for manufacturing such composite materials are disclosed.

22 Claims, 2 Drawing Sheets

COMPOSITE MATERIALS AND METHODS FOR MANUFACTURING COMPOSITE MATERIALS

FIELD OF THE INVENTION

The present invention relates to composite materials constructed from a primary metallic material and having one or more secondary regions composed of a secondary material having disparate thermal conductivity properties. More specifically, composite materials are provided comprising a primary metallic material metallurgically bonded to one or more regions of secondary material having a high thermal conductivity that serves as a heat sink. In one embodiment, the primary metallic material comprises titanium and the secondary material having high thermal conductivity comprises a metallic composite material or a metal matrix material such as aluminum silicon carbide. The present invention also relates to methods of manufacturing such composite materials.

BACKGROUND OF THE INVENTION

Metallic materials are used in numerous applications where rigidity and high mechanical strength are required. For applications in which low density, lightweight metallic materials are desirable, aluminum and titanium metallic materials are generally suitable. Aluminum and titanium can be fusion welded to materials having compatible properties to provide a reliable and hermetic seal. For many applications, titanium exhibits superior properties and is a material of choice. Titanium, however, has relatively low thermal conductivity. For applications such as housings for electronic or electrical devices, where dissipation of heat from inside a three-dimensional structure or across a surface is necessary or desirable, titanium has generally not been considered as a consequence of its thermal conductivity properties.

Metal matrix composite materials, which incorporate a non-metallic reinforcing material dispersed within a metal matrix or host material, generally have desirable properties for many applications, including a low density, low CTE, high thermal conductivity and good mechanical strength. These properties may be manipulated somewhat by selecting the metal matrix material and the form, proportion and composition of the reinforcing material. Metal matrix materials comprising aluminum or aluminum alloy matrices incorporating silicon carbide reinforcing material have desirable properties for many applications.

Metal matrix composite materials have several practical disadvantages. Such materials generally cannot be machined and are provided in a three-dimensional configuration using a casting process. The use of casting techniques limits the tolerances and versatility of the three dimensional configurations available and increases the cost of producing three dimensional shapes. Metal matrix materials generally cannot be laser welded as a consequence of differences in energy absorption rates between the metal matrix material and the non-metal reinforcing material. Such materials must be joined to other components or structural materials using soldering or welding techniques, which are generally less reliable than fusion welding techniques.

It would therefore be desirable to provide a composite material in which the desirable properties of titanium and similar metals may be used advantageously, while additional desirable properties, such as high thermal conductivity, are also provided.

SUMMARY OF THE INVENTION

The present invention provides composite materials constructed from a primary metallic material metallurgically bonded to one or more secondary regions having desirable thermal conductivity properties and having a CTE that generally matches the CTE of the primary metallic material. The composite regions serve as heat sinks and provide thermal dissipation over a surface area or across a surface. The metallic material is preferably chemically reactive with a metallic constituent of the secondary region, providing a metallurgical bond between the metallic material and the one or more secondary regions. The CTE match of the secondary material with the primary metallic material and the metallurgical bond formed between the secondary material and the primary metallic material provide a composite material having reliable hermeticity and desirable mechanical strength properties.

One or more thermal coefficient of expansion property modifiers, such as one or more non-metallic reinforcing material(s), may be incorporated into the secondary material in a proportion sufficient to modify the CTE of the secondary region(s) so that it is compatible with the CTE of the primary metallic material. The metallic constituent of the secondary material preferably has a higher thermal conductivity than that of the primary metallic package material. Thus, the thermal conductivity of the secondary region(s) is different from (generally higher than) the thermal conductivity of the primary metallic material, yet the CTE of the secondary material substantially matches the CTE of the primary metallic material.

According to one embodiment, the primary metallic material comprises titanium, or a titanium alloy, and the one or more secondary regions(s) comprises a metal matrix composite material having a high thermal conductivity, such as aluminum silicon carbide (AlSiC). In this embodiment, the metallic aluminum component of the metal matrix material bonds metallurgically with the titanium component of the primary metallic material at the interface of the secondary region(s) with the primary metallic material. A desired proportion of silicon carbide material is provided in the metal matrix composite material such that the secondary region has a CTE that substantially matches the CTE of the surrounding primary metallic material. According to especially preferred embodiments, the CTE of the secondary region is slightly less than the CTE of the surrounding metallic base material.

According to another embodiment, the primary metallic electronics package material comprises titanium or a titanium alloy, and one or more secondary regions comprises a secondary material having a high thermal conductivity, such as composite metallic material. The term "composite" material, as used herein, refers to compositions composed of multiple base materials that are present in a variety of chemical and physical configurations. Composite materials thus comprehend both conventional "composite" materials, in which the constituents retain their individual chemical and structural integrity, and alloys, in which the constituents combine to form entities distinct from the individual constituents. Using this combination of primary and secondary materials, a metallurgical bond may be formed between the metallic package material and the secondary composite material. Additionally, the secondary metallic composite material has a high thermal conductivity compared to the thermal conductivity of the primary metallic material, yet the CTE of the secondary composite material substantially matches the CTE of the primary metallic package material.

This arrangement provides a composite material having desirably lightweight and low density properties that is particularly suitable for use in structural applications, such as housings, in which dissipation of heat over a surface area or across a surface is desired. The primary metallic material may be economically and conveniently formed in a two or three dimensional configuration using numerous conventional techniques, including machining, metal injection molding, casting, forging, or superplastic forming techniques. Using a primary metallic material that is machinable is desirable because machining operations achieve high tolerances and also provide versatility, since modifications to a two or three dimensional configuration may be provided simply by modifying the machining process.

BRIEF DESCRIPTION OF THE DRAWINGS

Preferred embodiments of the present invention will be described with reference to the figures, in which.

DESCRIPTION OF PREFERRED EMBODIMENTS

Figure 1:
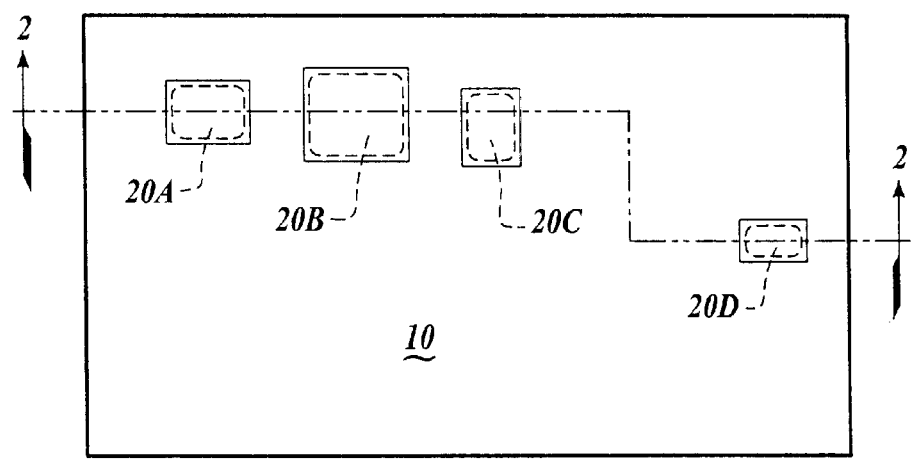
FIG. 1 illustrates a top view of a sheet of primary metallic material of the present invention having several recesses for receiving secondary having high thermal conductivity and a CTE generally matching the CTE of the base material.

Composite materials of the present invention are composed of a primary metallic component and one or more secondary regions having thermal conductivity properties that are different from the thermal conductivity properties of the primary metallic material. A metallic component of the electronics package is metallurgically compatible with a metallic component of the secondary material, such that a metallurgical bond may be formed between the primary metallic material and the secondary region(s). The CTE of the secondary material generally matches the CTE of the primary metallic material. The secondary regions are arranged to provide one or more heat sinks in the primary material, providing for dissipation of heat over a surface area or across a surface. The composite materials of the present invention may be used in two or three dimensional shapes as housings, for example, in which the secondary regions serve to dissipate heat generated within the housing over a surface area or to the exterior of the housing. Secondary regions may alternatively or additionally may be arranged to provide one or more substrate(s) for mounting electronic components such as ceramic chips.

Preferred primary metallic materials comprise a metallic constituent having desirable properties for a selected application. Suitable metallic constituents generally have low density for lightweight applications, good mechanical strength and hermeticity, and a CTE of about 13 ppm/° C. or less. Primary metallic materials comprising titanium, beryllium, magnesium and composite materials such as A40, an aluminum silicon composite metal, are suitable. Primary package materials comprising titanium are preferred. Commercially pure titanium materials are suitable, such as CP70, as are titanium alloys such as 6A14V, and other titanium alloys comprising at least about 60% titanium, more preferably at least about 80% titanium and most preferably at least about 90% titanium. Preferred metallic species in titanium alloys include aluminum, vanadium, and magnesium. The metallic base material most preferably has a CTE of from about 10 to 11 ppm/° C.

The primary metallic materials of the present invention may be a material having a uniform composition throughout its cross-section or, alternatively, may be a composite metallic material comprising, for example, two or more layers of materials having different properties. Explosion welded composite metallic materials are preferred, with composite materials comprising a ferrous material explosion welded to a titanium containing metallic material being especially preferred. A stainless steel material explosion welded to a commercially pure titanium material, or to a titanium alloy described above, is especially suitable for applications that are not weight sensitive. The composite metallic material may be fabricated in a two or three dimensional shape, as desired, to take advantage of the materials. Secondary regions may be provided as heat sinks in a titanium portion of the material.

Primary metallic structures may be economically produced in a variety of two- or three-dimensional configurations by machining, metal injection molding, casting, forging, stamping, drawing, coining, powder metallurgy, or superplastic forming techniques. Three-dimensional structures such as housings having an interior space for mounting one or more electronics devices, with feedthrough holes for receiving connectors or other feedthrough devices, may be conveniently fabricated using a variety of techniques.

The secondary material has a relatively high thermal conductivity and a CTE that generally matches the CTE of the primary metallic material. Many different types of secondary materials are suitable, including composite metal-containing and ceramic-containing materials. The secondary material preferably comprises one or more of the following materials: aluminum, silicon carbide, aluminum silicon carbide (AlSiC), aluminum aluminum oxide (AlAl$_2$O$_3$), aluminum oxide, magnesium oxide, boron oxide, aluminum graphite, beryllium beryllium oxide (BeBeO), beryllium oxide, aluminum boron oxide, magnesium aluminum oxide (MgAl$_2$O$_3$), titanium, titanium aluminide (all phases), titanium aluminide infiltrated with copper, aluminum, silver, gold, nickel and other metals, titanium/copper intermetallics, titanium molybdenum, titanium tungsten and other titanium compounds, molybdenum, tungsten, tungsten carbide, aluminum beryllium metallic composites such as ALBEMET™, aluminum nitride, beryllium oxide, copper molybdenum compounds, copper tungsten, ferrous metals such as iron-nickel alloys, and composite metals.

According to one embodiment, the secondary material comprises: (1) a metallic component that is metallurgically compatible with a metallic component of the primary material; and (2) a thermal property modifier, such as a reinforcing material, that is capable of modifying the CTE of the secondary material. The reinforcing material may be metallic or non-metallic. Metallic materials such as tungsten and molybdenum may be used, as well as non-metallic, ceramic materials. Metal matrix composite materials including aluminum silicon carbide, beryllium beryllium oxide, aluminum aluminum oxide, aluminum boron oxide, magnesium aluminum oxide, and the like are suitable and are preferred. Aluminum silicon carbide is a preferred metal matrix composite material for use with primary metallic materials comprising titanium. Beryllium beryllium oxide is a preferred secondary material for use with primary metallic materials comprising beryllium. The secondary material may be provided in one or more regions in a two- or three-dimensional primary base structure.

Composite metallic materials may also be used as secondary materials to provide high thermal conductivity regions. Composite metallic materials such as titanium aluminide, titanium copper intermetallics, titanium molybdenum compounds, titanium tungsten compounds, and titanium aluminide infiltrated with copper, aluminum, silver, nickel and other metallic species are suitable. Other metallic composites such as ALMEBET™, an aluminum beryllium composite, aluminum nitride, copper molybdenum, copper tungsten and A40, an aluminum silicon composite, are also suitable.

A metallic component of the secondary material forming one or more high thermal conductivity region(s) is metallurgically compatible with, and therefore may be metallurgically bonded to, the primary metallic material. Secondary materials comprising aluminum as a metallic component are especially preferred for use with primary structures comprising titanium because aluminum and titanium metallic materials bond metallurgically to provide a high degree of hermeticity and mechanical integrity. Forming a metallurgical bond between the primary material and the secondary material furthermore provides manufacturing advantages, because it does not require welding, soldering, brazing or the like.

The secondary composite material preferably has a CTE matched within at least about 2 units (ppm/° C.) to the CTE of the primary material. Thus, the desired CTE of an aluminum silicon carbide composite material used in connection with a titanium base material having a CTE of about 10 to 10.5 ppm/° C. is preferably from about 8 to 12.5 ppm/° C. In this example, the CTE of the metallic constituent of the secondary material, aluminum, is considerably higher than the desired CTE for the secondary metal matrix material, and silicon carbide reinforcing material is introduced and/or concentrated to provide a composite metal matrix material having the desired CTE of from about 8 to 12.5 ppm/° C. Commercially available aluminum silicon carbide generally has a silicon carbide concentration of approximately 10% to 30%, by volume. This material has desirably high thermal conductivity properties, but it has an undesirably high CTE. Aluminum silicon carbide matrix materials in which the reinforcing silicon carbide material approaches a concentration of approximately 50% by volume has an appropriate CTE. Casting and other methods for achieving a desirably high load of reinforcing silicon carbide in the composite material are described below.

In an especially preferred embodiment wherein the primary structure comprises a titanium material having a CTE of from about 10 to 10.5 ppm/° C., the high thermal conductivity secondary material preferably has a CTE of from about 9.5 to 10.5 ppm/° C., just slightly below the CTE of the primary material. In this embodiment, the slight CTE difference provides a compressive bond between the secondary material and the primary material that enhances the mechanical strength of the composite structure.

Figure 2:
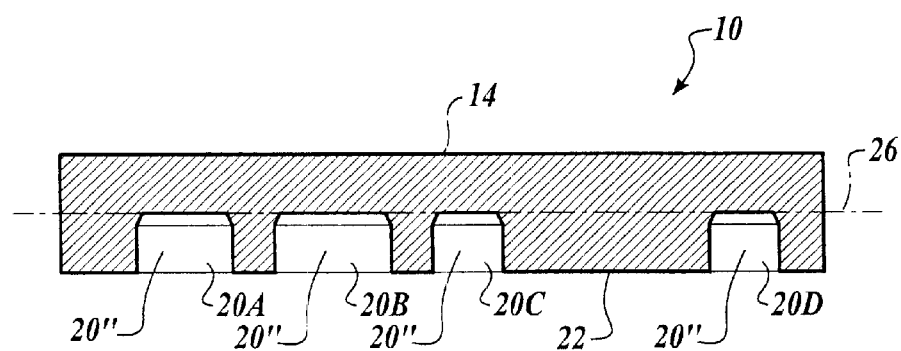
FIG. 2 illustrates a cross-sectional view of the sheet of primary metallic material of FIG. 1 taken along line 2—2 of FIG. 1.

FIG. 1 illustrates a top view and FIG. 2 illustrates a cross-sectional view of a primary metallic structure of the present invention for receiving a plurality of secondary regions. Primary metallic structure 10 is provided in a two-dimensional sheet form. One or more recesses, illustrated in FIGS. 1 and 2 as recesses 20A, 20B, 20C and 20D are provided in the exterior surface 22 of primary structure 10. Recesses 20A–D are provided for receiving a secondary material having thermal conductivity properties different from the thermal conductivity properties of the primary material. Recesses 20A–D may penetrate the primary structure 10. Alternatively, as shown in FIG. 2, recesses 20A–D may terminate at caps 24A–D projecting from and forming part of interior floor 14 of the primary structure. Recesses 20A–D may be provided having various sizes and configurations and are preferably formed by machining from exterior surface 22 and/or interior floor 14 of primary structure 10.

The location and surface area size and configuration of recesses 20 and, thus, the location, surface area size and configuration of the secondary regions provided as heat sinks, may be selected depending on the thermal dissipation requirements of particular applications. Recesses 20 may be provided in a generally square, rectangular, polygonal, circular or oval configuration to provide secondary regions having a generally square, rectangular, polygonal, circular or oval surface area configuration. Recesses 20 may be chamfered, as shown in FIG. 2, to provide additional volume for receiving the secondary material.

Suitable secondary materials having thermal conductivity properties different from the thermal conductivity properties of the primary structure have been described and may be provided in recesses 20A–D using various techniques. Two manufacturing techniques are described herein, but it will be understood that various alternative techniques may be implemented as well. Preferred manufacturing techniques are described with reference to a primary structure comprising titanium metal and a secondary region comprising aluminum silicon carbide. According to one preferred technique, the secondary material is cast into a preformed primary metallic structure. According to another preferred embodiment, a pre-formed secondary material insert having the desired thermal conductivity and CTE properties is melted or squeeze cast into recess(es) in the base structure. In general, the secondary region may be formed using a variety of techniques, including vacuum/pressure casting, die casting, gravity casting, squeeze casting or centrifugal casting techniques; forging techniques; superplastic forming techniques; metal injection molding techniques; and powder metallurgy techniques using sintering and/or infiltration methods.

More specifically, in a manufacturing technique in which the secondary region is cast into the primary structure, primary structure 10 is thoroughly cleaned to remove any oxidation products or foreign materials using, for example, methyl ethyl ketone (MEK) and an acetone wash. A release agent such as boron nitride is applied to surfaces of the primary structure that are not desired to be metallurgically bonded to the secondary material. For most applications, the release agent is applied to the exterior surface areas of the primary structure, as well as to the interior floor 14. This facilitates formation of a metallurgical bond between the primary material and the secondary material at only the surface areas of recesses 20A–D.

Desired interface surfaces of the primary structure with the secondary material, such as the interior surfaces of recesses 20A–D, are contacted with a metallurgically compatible material, such as an aluminum-containing material, under conditions that promote formation of a metallurgical bond between the primary metallic material, e.g. titanium, and a metallurgically compatible material, e.g., aluminum. A metallurgical bond is formed when two metallic components, such as titanium and aluminum, react chemically to form intermetallic bonds. In the embodiment described herein, aluminum reacts with the titanium metallic component of the primary structure to form an inter-metallic species, such as titanium aluminide, $TiAl_3$.

In one embodiment, an aluminum coating is metallurgically bonded to desired interface surfaces of a titanium primary structure by contacting the desired interface surfaces with molten aluminum. In this embodiment, a secondary material comprising an aluminum metallic component may subsequently be bonded to the aluminum coating and, hence, to the titanium primary structure.

Alternatively, a secondary material comprising an aluminum or aluminum alloy metallic component may be directly metallurgically bonded to desired interface surfaces of the primary structure. Aluminum silicon carbide secondary material comprising silicon carbide in a concentration of from about 10% to about 50% by volume, and more preferably about 20% by volume, may be provided in a molten form and agitated or otherwise maintained in a suspended and homogeneous condition. Aluminum silicon carbide may be maintained in a molten condition, for example, in an appropriate receptacle at a temperature of about 1350° F.

Desired interface surfaces of the titanium primary structure are contacted to the metallurgically compatible molten metallic or secondary material using any appropriate technique, such as dipping in the molten aluminum or aluminum silicon carbide material, under conditions that substantially prevent the formation of oxides at the interface of the primary structure and the molten secondary material. The molten aluminum silicon carbide may be maintained, for example, in an enclosed space under an argon cover gas to prevent or retard the formation of oxides at the metallurgical bond interface. The primary structure may be dipped and maintained in contact with the molten aluminum-containing material for a reaction period sufficient to establish a metallurgical bond between the aluminum and titanium metallic materials in exposed areas of the primary structure that are free of the release agent. A retention time of five minutes is generally sufficient to provide a metallurgical bond between titanium and molten aluminum. Alternative materials and aluminum-containing secondary materials may require alternative temperatures and retention times.

Following the formation of a metallurgical bond at desired interface surfaces of the primary structure and the secondary material, recesses 20A–D are packed or filled with a secondary material. This may be accomplished in a single process step when the primary structure is dipped or submerged in molten secondary material, such as aluminum silicon carbide. In this embodiment, the primary structure is removed from the molten secondary material so that molten secondary material fills recesses 20A–D. The assembly, comprising the primary structure having recesses 20A–D filled with molten aluminum silicon carbide secondary material may be permitted to cool.

The cooled assembly, or the assembly with the secondary material in a molten or partially molten form, is preferably treated to concentrate the silicon carbide material, forming an aluminum silicon carbide material in the interior volume of recesses 20A–D having the desired CTE properties. As described above, conventional aluminum silicon carbide materials having a concentration of silicon carbide reinforcing material of about 20% by volume, have an undesirably high CTE. Silicon carbide reinforcing materials are therefore concentrated according to methods of the present invention to provide composite regions having a silicon carbide concentration of from about 30% to about 60% by volume, and more preferably from about 45% to about 55% by volume, and having a CTE of from about 8 to about 12.5 ppm/° C., more preferably of from about 9 to 11ppm/° C.

The silicon carbide reinforcing material may be provided in the form of particles having a generally uniform particle size. Alternatively, distributions of various silicon carbide particle sizes may be preferred to obtain the desired packing density. Silicon carbide particle sizes of from about 5 microns to about 250 microns are suitable, with particle sizes of from about 5 microns to 150 microns being especially preferred. A multimodal distribution of particle sizes provides the desired packing density in the most efficient manner.

According to one embodiment, the assembly is treated in a heated centrifuge to provide the desired packing density of silicon carbide constituents in the secondary material loaded in recesses 20A–D. During centrifugation, silicon carbide particles migrate through the molten aluminum base matrix material in the direction of arrow B toward interior surface 14 of primary structure 10. Centrifugation is carried out under conditions that promote migration of silicon carbide particles through the molten secondary matrix material filling recesses 20A–D to provide a concentration of silicon carbide constituents of from about 25% to about 60% by volume, and preferably of from about 35% to 55% by volume in areas 20' of recesses 20A–D. Areas 20" of recesses 20A–D have a considerably lower loading of silicon carbide particles following centrifugation. Following concentration of silicon carbide constituents in areas 20', areas 20" of recesses 20A–D principally comprise the aluminum matrix material.

The assemblies are preferably maintained at a temperature sufficient to maintain the metallic constituent of the secondary material in a molten form during centrifugation. Temperatures of about 1350° F. are suitable to maintain the aluminum metallic constituent of aluminum silicon carbide composite materials in a molten form. Temperatures of less than 1375° F. are preferred to prevent the formation of aluminum carbide. Centrifugation at gravitational forces of from about 200 g to about 1200 g are suitable, with forces of about 200 g to 400 g being especially preferred. Suitable centrifugation conditions and times may be ascertained by means of routine experimentation depending on the materials being used and the desired CTE properties of the secondary matrix material. It is noted also that different casting techniques may be adapted for use with alternative materials. For some suitable secondary materials, including secondary materials comprising aluminum as the base or host metal, the reinforcing particles may be lighter than the base metal and centrifugation will have the effect of concentrating the metallic species rather than the particulate or secondary reinforcing species. Suitable casting techniques may be developed and implemented for such materials using routine experimentation.

Following concentration of the silicon carbide particles in the desired areas 20' of the primary structure recesses 20–D, the assemblies are thoroughly cooled. Material comprising a portion of the primary structure, as well as material in areas 20" of recesses 20A–D, may be removed from the base structure, for example, by machining along dashed line 26. If the secondary material in areas of recesses 20A–D in proximity to dashed line 26 comprises silicon carbide material, diamond cutters may be required to remove the material. Caps 24 forming a part of the primary structure may also be removed from interior surface 14 of base structure 10 following processing, by machining or other techniques, to expose the concentrated metal matrix secondary material metallurgically bonded to the primary structure in recesses 20A–D. Alternative reinforcing materials for use with a secondary material comprising aluminum include tungsten and molybdenum metallic materials. Such metallic materials may be concentrated to provide desired CTE properties using techniques similar to those described above.

According to an alternative manufacturing technique, primary structures 10 having recesses 20–D with their interior surfaces coated with and metallurgically bonded to an aluminum coating, may be filled with a pre-fabricated pellet comprising the desired composition of a secondary material and subsequently heated, for example, in a belt furnace, to melt the secondary material and metallurgically bond it to the aluminum coating and, hence, to the primary structure. Secondary materials having the desired concentration of silicon carbide particles in an aluminum host matrix material may, for example, be provided in a pellet form. Squeeze casting techniques may also be employed to bond the secondary material in a recess in the base material.

Alternative manufacturing techniques may involve the use of powdered metal technology. In one embodiment, a prefabricated insert comprising powdered aluminum and silicon carbide in the form of a pellet may be placed in a recess of the primary structure having an aluminum coating and metallurgically bonded to the aluminum coating using a vacuum melt process. A similar technique may be used to bond metallic powder comprising titanium aluminide in a recess in the primary structure. A titanium aluminide secondary region may additionally be impregnated or infiltrated with another metallic material, such as copper, silver, gold, or the like, to achieve the desired CTE. When a prefabricated pellet of secondary material is used, it may be inserted in the desired primary structure recess and infiltrated with a metallic material that forms a metallurgical bond with the primary structure, or with a coating applied to the primary structure in the area of the recess.

According to yet another embodiment, a secondary material comprising a powdered metal or ceramic material may be packed into a pre-established cavity in the primary structure. The secondary material may comprise a powder or particulate form of one or more of the following materials: titanium, molybdenum, tungsten, aluminum, copper, gold, silver, beryllium, iron/nickel alloys, other iron-containing alloys, aluminum oxide, boron oxide, aluminum nitride, silicon carbide, tungsten carbide, and mixtures thereof Titanium aluminide is a preferred secondary material for use in a powdered or particulate (or bead) form. Such secondary materials, and combinations of such materials, may be packed into one or more cavities of an electronics package preform. The secondary powdered metal and/or ceramic material may then be sintered to bond the powdered material together and to provide a metallurgical bond between the secondary material and the primary structure. Following sintering, another material, such as metallic material, may be infiltrated into a porous, sintered, secondary material. In an exemplary embodiment, copper is infiltrated into a sintered titanium-containing secondary region, preferably a titanium-aluminide secondary region.

Fabrication methods involving the use of secondary materials in a pellet or powdered or particulate form are as follows. A block or sheet of the primary structure material is provided. Recesses having the dimensions and configurations of desired secondary regions are then provided, for example, by machining in one surface of the block of primary electronics package material. The desired secondary material is provided and bonded in the recesses. Any desired two- or three-dimensional configuration may then be provided, for example, by machining the opposite face of the block of primary material. The secondary region(s) may be "intrusive," meaning that the secondary regions are exposed to both opposing surfaces of the primary structure. Alternatively, the secondary regions may be "nonintrusive," meaning that the secondary regions are exposed only on one surface of the primary structure. The nature of the secondary regions may be altered, for example, by altering the depth and dimensions of the recesses in the primary structure, or by altering the machining process during formation of the primary structure.

According to yet another embodiment of composite materials of the present invention, a ceramic, electrically insulating material may be provided as a layer between the primary structure material and the secondary material. In this embodiment, a wafer or thin film of ceramic material is placed in the recess provided in the primary metallic structure prior to introducing and bonding the secondary material into the recess. During bonding of the secondary material to the recess in the primary structure, the ceramic insulator material is bonded in place. During later processing, for example, by machining the block of primary structure material, the ceramic insulator may be exposed on a surface of the primary structure.

Figure 3:
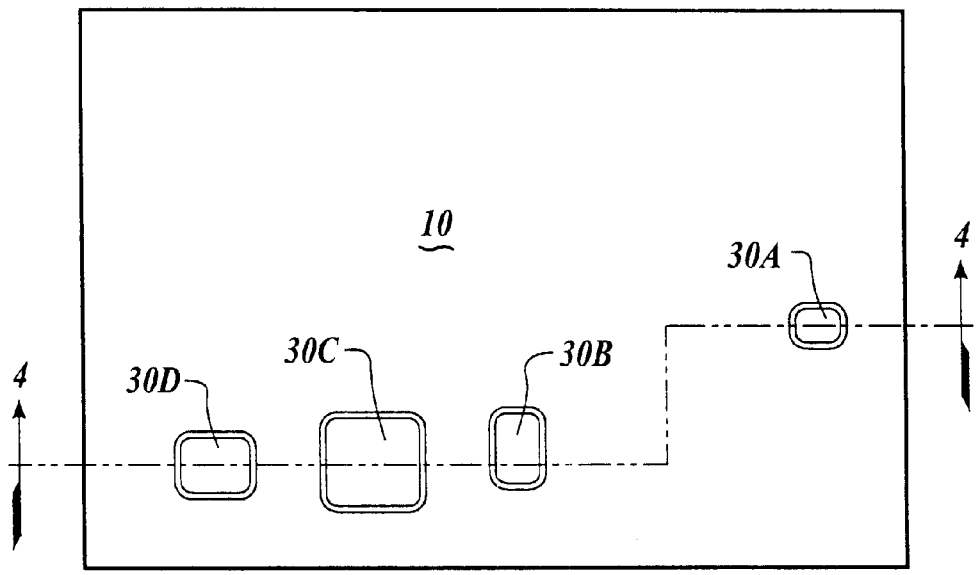
FIG. 3 illustrates a top view of a composite material of the present invention comprising a sheet of primary metallic material having several secondary regions.
Figure 4:
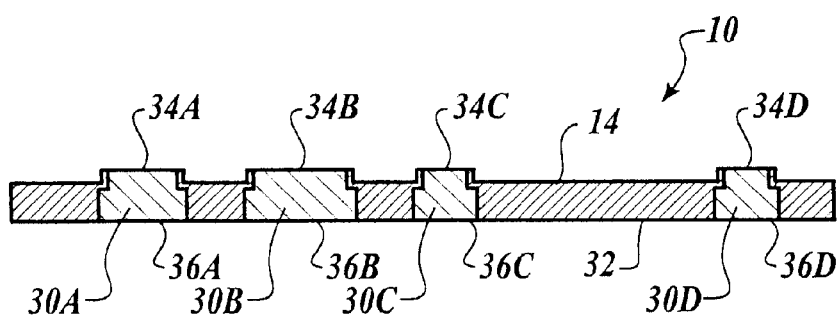
FIG. 4 illustrates a cross-sectional view of the composite material of FIG. 3 taken along line 4—4 of FIG. 3.

FIGS. 3 and 4 illustrate primary structure 10 having a plurality of secondary regions 30A–D, the secondary regions having a high thermal conductivity and a CTE that generally matches the CTE of primary structure 10. As described above, secondary regions 30A–D preferably have a high thermal conductivity and serve as heat sinks to dissipate heat. Additionally, secondary regions 30A–D preferably have a CTE that generally matches or is slightly lower than the CTE of the material comprising the primary structure. Secondary regions having a CTE of from about 8 to about 12.5 ppm/° C. are preferred, with regions having a CTE of from about 9 to 11 ppm/° C. being especially preferred.

Secondary regions 30A–D penetrate the floor of primary structure in the embodiment illustrated and have interior exposed surfaces 34A–D and exterior exposed surfaces 36A–D aligned with exterior surface 32 of primary structure 10. Interior exposed surfaces 34A–D may protrude somewhat from interior surface 14 of primary structure 10, as shown, or interior exposed surfaces of the secondary regions may be flush with interior surface 14. Although secondary regions 30A–D are illustrated as penetrating primary structure 10 and having exposed interior and exterior surfaces, it will be recognized that secondary regions that partially penetrate the primary structure 10 and have only one exposed surface, either an exterior or an interior exposed surface, may also be suitable for certain applications. Multiple secondary regions in a primary structure may comprise the same material, or secondary regions having different compositions and, hence, different thermal conductivity and/or CTE properties, may be provided in a primary structure. Similarly, although the secondary regions are illustrated in a two-dimensional base structure, it will be appreciated that secondary regions having desirable thermal conductivity properties may be provided in various locations in three-dimensional structures, as well, using techniques similar to those described herein.

While the present invention has been described with reference to certain preferred embodiments, and certain preferred manufacturing techniques have been described, it will be understood that alternative embodiments and manufacturing techniques may be developed and adapted without departing from the principles of the invention.

We claim:

1. A composite material comprising:
   a primary metallic base material forming a primary metallic structure having one or more recesses, wherein the primary metallic base material has a first thermal conductivity and a first coefficient of thermal expansion (CTE);

a secondary material disposed within the one or more recesses of the primary metallic base material, wherein said secondary material has a second thermal conductivity higher than the first thermal conductivity and a second CTE that substantially matches the first CTE.

2. A composite material according to claim 1, in which the primary metallic material comprises at least one of the materials selected from the group consisting of titanium, beryllium, magnesium, aluminum composite metallic materials, and ferrous metallic materials.

3. A composite material according to claim 1, in which the secondary material comprises a metal matrix composite material.

4. A composite material according to claim 1, in which the secondary material comprises aluminum.

5. A composite material according to claim 1, in which the secondary material is aluminum silicon carbide.

6. A composite material according to claim 1, in which the first and second CTEs are matched within at least two units.

7. A composite material according to claim 6, which the second CTE is less than the first CTE.

8. A composite material according to claim 1, in which the secondary material comprises at least one of the materials selected from the group consisting of aluminum, silicon carbide, aluminum silicon carbide, beryllium, beryllium oxide, magnesium aluminum oxide, titanium, titanium aluminide, a titanium copper intermetallic compound, titanium molybdenum, titanium tungsten, aluminum metallic composite materials, aluminum nitride, beryllium oxide, copper molybdenum, copper tungsten, tungsten, tungsten carbide, molybdenum, copper, gold, silver, and ferrous metallic materials.

9. A composite material according to claim 1, in which the primary metallic structure comprises a composite metallic material.

10. A composite material according to claim 1, in which the primary metallic structure comprises at least two layers of metallic materials having different properties.

11. A composite material according to claim 10 in which the primary metallic structure comprises an explosion welded composite metallic material.

12. A composite material according to claim 1, in which the primary metallic base material comprises titanium metallurgically bonded to a secondary material comprising aluminum, wherein the primary metallic material and the secondary material have different thermal conductivity properties.

13. A composite material according to claim 12, in which the secondary material comprises a metallic component that is metallurgically compatible with titanium and a thermal property modifier that is capable of modifying the CTE of the secondary material.

14. A composite material according to claim 13, in which the thermal property modifier is a non-metallic reinforcing material.

15. A composite material according to claim 13, in which the thermal property modifier is a metallic reinforcing material.

16. A composite material according to claim 12, in which the secondary material comprises a aluminum silicon carbide.

17. A composite material according to claim 12, additionally comprising an electrical insulator material bonded to the secondary material.

18. A composite material according to claim 1, wherein the one or more recesses has a generally square, rectangular, polygonal, circular or oval configuration.

19. A composite material according to claim 1, wherein the secondary material disposed within the recesses is intrusive.

20. A composite material according to claim 1, wherein the secondary material disposed within the recesses is non-intrusive.

21. A composite material according to claim 1, wherein the secondary material disposed within the recesses has surfaces that are flush with the surfaces of the primary metallic base material.

22. A composite material according to claim 1, wherein the secondary material disposed within the recesses has at least one surface that is raised relative to a surface of the primary metallic base material.

* * * * *